United States Patent
Dietrich

(10) Patent No.: US 10,482,921 B2
(45) Date of Patent: Nov. 19, 2019

(54) ERROR DETECTION CODE HOLD PATTERN SYNCHRONIZATION

(71) Applicant: MICRON TECHNOLOGY, INC., Boise, ID (US)

(72) Inventor: Stefan Dietrich, Türkenfeld (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/262,661

(22) Filed: Jan. 30, 2019

(65) Prior Publication Data

US 2019/0164574 A1 May 30, 2019

Related U.S. Application Data

(63) Continuation of application No. 15/606,185, filed on May 26, 2017, now Pat. No. 10,224,072.

(51) Int. Cl.
| | |
|---|---|
| *G11B 20/18* | (2006.01) |
| *G11C 7/22* | (2006.01) |
| *G11C 29/12* | (2006.01) |
| *G11C 29/04* | (2006.01) |
| *G11B 20/12* | (2006.01) |

(52) U.S. Cl.
CPC ........... *G11B 20/18* (2013.01); *G11C 7/22* (2013.01); *G11C 29/12015* (2013.01); *G11B 2020/1222* (2013.01); *G11B 2020/1843* (2013.01); *G11C 2029/0411* (2013.01); *G11C 2029/1204* (2013.01)

(58) Field of Classification Search
CPC .......... G11B 20/18; G11B 2020/1222; G11B 2020/1843; G11C 7/22; G11C 29/12015; G11C 2029/1204; G11C 2029/0411
See application file for complete search history.

(56) References Cited

U.S. PATENT DOCUMENTS

| | | |
|---|---|---|
| 9,665,507 B2 | 5/2017 | Shaeffer et al. |
| 2008/0225603 A1 | 9/2008 | Hein |
| 2009/0222707 A1 | 9/2009 | Beom-Ju et al. |
| 2009/0222713 A1 | 9/2009 | Beom-Ju et al. |
| 2012/0216095 A1* | 8/2012 | Ha .................. G06F 11/1004 714/758 |
| 2013/0311717 A1 | 11/2013 | Chan-Kyung et al. |
| 2014/0044157 A1 | 2/2014 | Chang et al. |
| 2014/0086002 A1 | 3/2014 | Doo et al. |
| 2017/0004869 A1 | 1/2017 | Shin et al. |
| 2018/0005686 A1 | 1/2018 | Oh |

OTHER PUBLICATIONS

PCT International Search Report & Written Opinion; PCT Application No. PCT/US2018/028402; dated Aug. 7, 2018.

* cited by examiner

*Primary Examiner* — Jerome Leboeuf
(74) *Attorney, Agent, or Firm* — Fletcher Yoder, P.C.

(57) ABSTRACT

A memory system includes a memory device, a command clock (CK_t clock) that provides a first clock signal at a first frequency, and a data path clock (WCK_t clock) that provides a second clock signal at a second frequency different than the first frequency. Data path circuitry is synchronized with the WCK_t clock and provides an error detection code (EDC) hold pattern during an idle state. EDC hold pattern synchronization logic synchronizes a start of transmission of the EDC hold pattern synchronous to the CK_t clock.

20 Claims, 4 Drawing Sheets

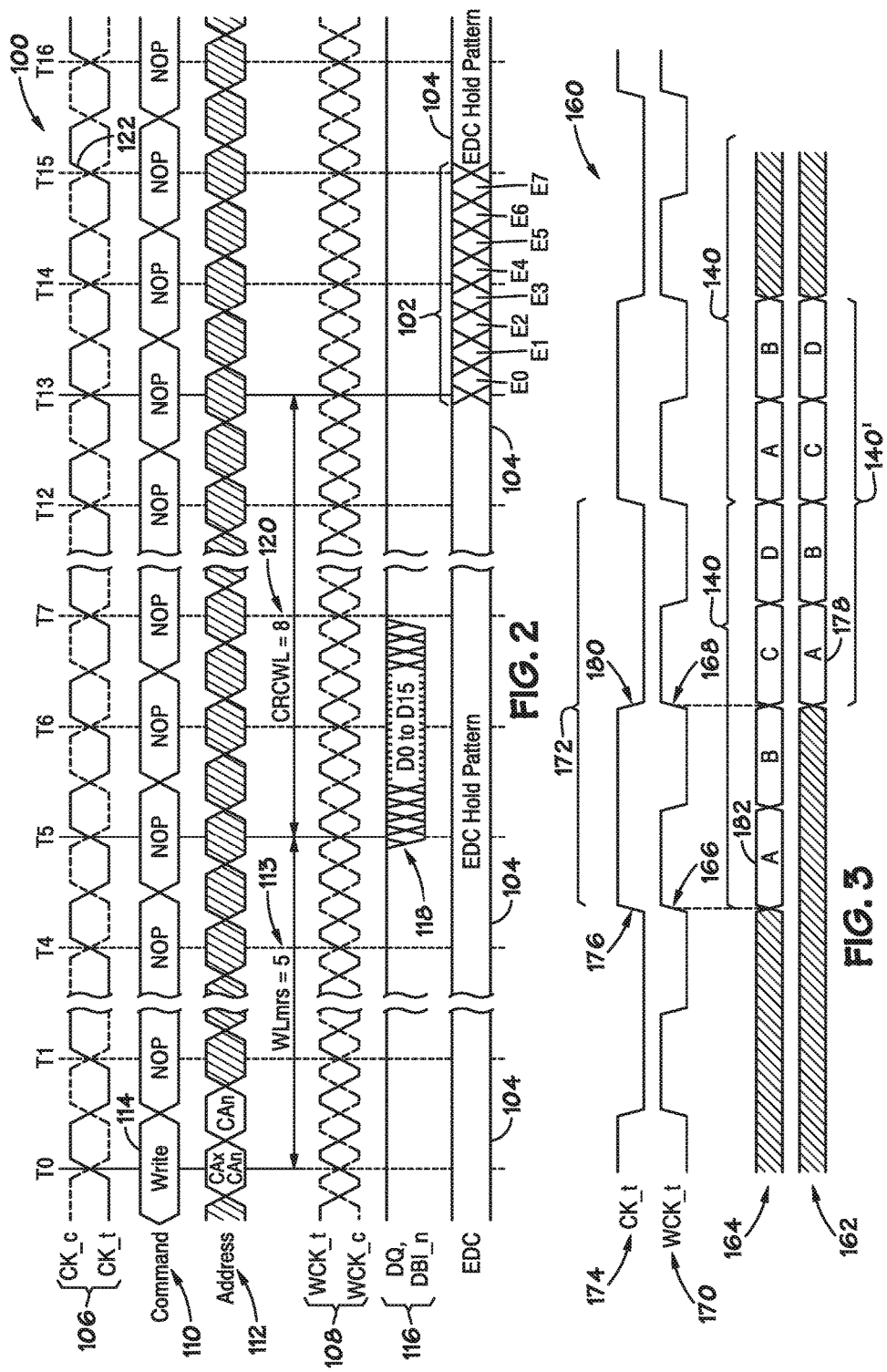

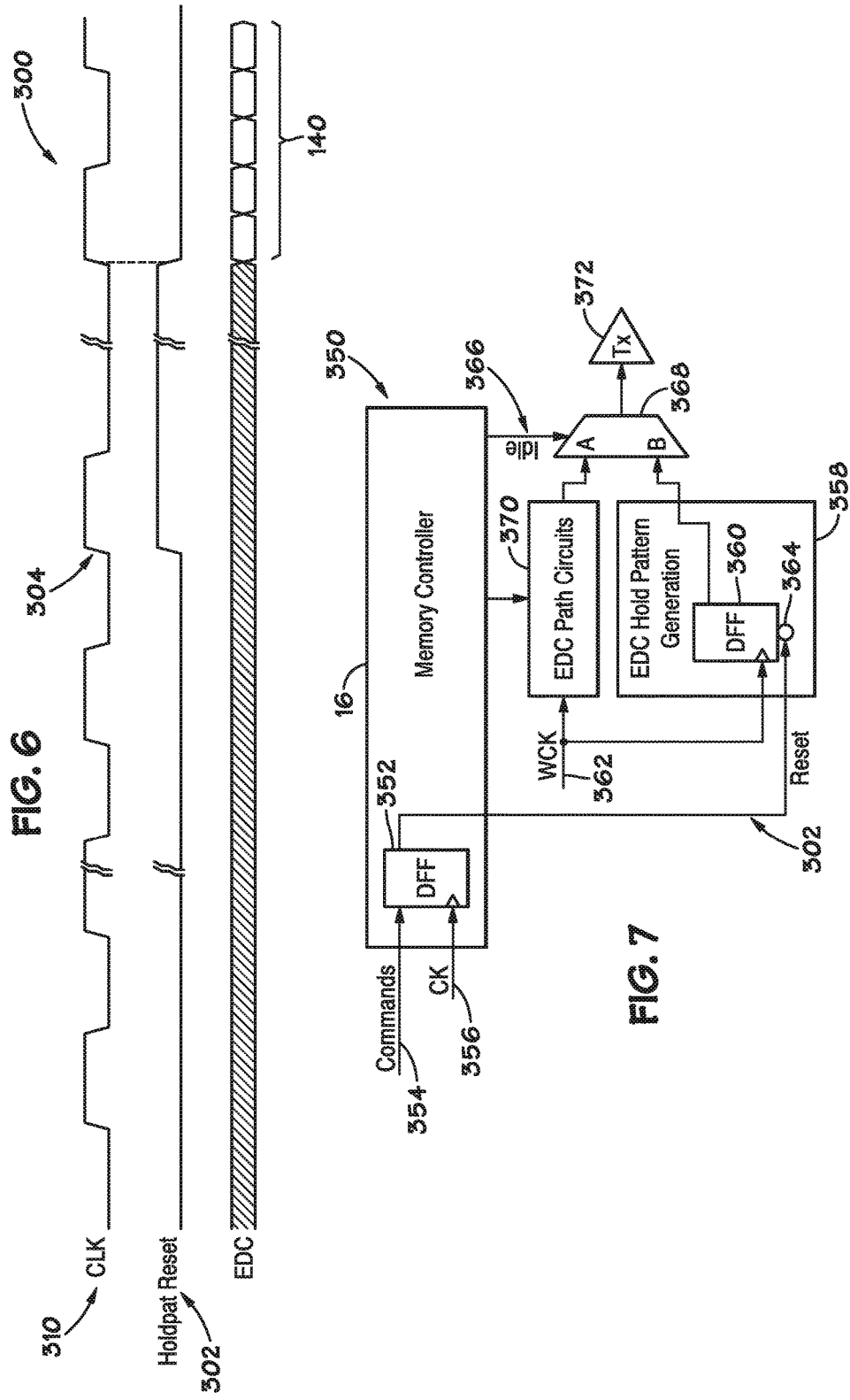

ERROR DETECTION CODE HOLD PATTERN SYNCHRONIZATION

CROSS-REFERENCE TO RELATED APPLICATIONS

The present application is a continuation of U.S. application Ser. No. 15/606,185, entitled "Error Detection Code Hold Pattern Synchronization," and filed May 26, 2017, the entirety of which is incorporated by reference herein for all purposes.

BACKGROUND

Embodiments described herein relate generally to the field of computer memory systems. More specifically, the current embodiments include one or more systems, devices, and methods for efficiently providing synchronized error detection code hold patterns.

Description of Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Memory devices may include error correction features that selectively provide an error indication upon error detection. For example, a memory device may include one or more pins through which error detection code (EDC), such as cyclic redundancy check (CRC) data for error detection is output. Generally, the semiconductor memory device includes a plurality of pins for transferring input/output data and signals. The memory device may include an EDC pin, which provides the EDC, including the CRC data for detecting an error in the read and write operations.

The memory device may output CRC data of the read or write operation through the EDC pin in an error detection mode, and through a data path for outputting a preset EDC hold pattern in a standby/idle state (e.g., when no read/write operations are occurring). Accordingly, such a memory device includes data path circuitry/logic that selects a first data path for outputting the CRC data of the read or write operation through the EDC pin in error detection mode, and a second data path for outputting a preset EDC hold pattern in standby mode.

According to certain specifications (e.g., specifications of the Joint Electron Device Engineering Council (JEDEC)), the EDC hold pattern may start synchronous to a rising edge of a system clock (CK). However, the data path circuitry/logic may be synchronized to a separate data clock (WCK). The system clock CK and the data clock WCK may run at different frequencies (e.g., the frequency of WCK may be twice that of the frequency of CK). Unfortunately, these differing frequencies may result in unsynchronized provision of the EDC hold pattern. Accordingly, embodiments described herein may be directed to one or more of the problems set forth above.

BRIEF DESCRIPTION OF DRAWINGS

FIG. 2 is a timing diagram, illustrating provision of EDC data and an EDC hold pattern, in accordance with an embodiment of the present disclosure;

FIG. 3 is a timing diagram, illustrating a comparison between unsynchronized EDC hold patterns and synchronized EDC hold pattern results of the current techniques, in accordance with an embodiment of the present disclosure;

FIG. 6 is a timing diagram, illustrating introduction of an EDC hold reset, resulting in proper synchronization of the EDC hold pattern, in accordance with an embodiment; and FIG. 7 is a block diagram, illustrating circuitry that may implement the EDC hold reset, in accordance with an embodiment.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, error detection code (EDC) hold pattern generation circuitry/logic may utilize an EDC hold reset to synchronize provision of an EDC hold pattern with a rising edge of a command clock (CK). As mentioned above, the EDC hold pattern may indicate a standby operation for error detection, as opposed to provision of EDC, via an EDC pin.

Figure 1A:
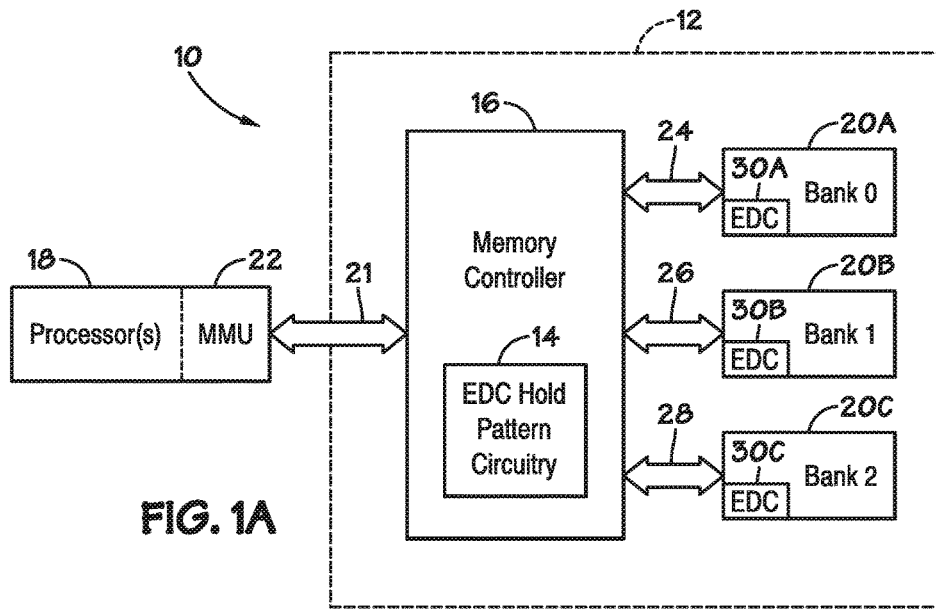
FIG. 1A is a block diagram illustrating a memory management system, in accordance with an embodiment.

FIG. 1A is a block diagram, illustrating an electronic device 10 that utilizes a memory management system 12 that coordinates EDC hold pattern synchronization via EDC hold pattern circuitry/logic 14 (e.g., of a memory controller 16), in accordance with an embodiment. As shown in FIG. 1A, the processor(s) 18 may communicate with the memory (e.g., memory banks 20A, 20B, and/or 20C) via the memory controller 16 and a bus 21. In general, an operating system (OS) running on the processor(s) 18 may allocate and deallocate memory at logical addresses. In some embodiments, a memory management unit (MMU) 22 of the processor(s) 18 may translate the logical addresses employed by the OS into physical addresses that generally correspond to a memory addresses understood by the memory controller 16. The MMU 22 may perform this translation using one or more translation look aside buffers (TLB) or any other suitable hardware. In some other embodiments, the OS of the processor(s) 18 may translate the logical addresses to the physical addresses. The memory controller 16 may receive instructions to read data from or write data to one of the physical address from the processor(s) 18.

Contiguous physical addresses requested by the processor(s) 18 may not directly correspond to contiguous actual memory addresses located on memory banks 20A, 20B, and 20C, shown in FIG. 1A as BANK 0, BANK 1, and BANK 2. Rather, the memory controller 16 may map the physical addresses requested by the processor(s) 18 to actual memory addresses, also referred to herein as "dual in-line memory module (DIMM) addresses," that may be distributed approximately evenly across all of the memory banks 20A, 20B, and 20C. The memory banks 20A, 20B, and 20C may include any suitable memory devices, such as double data rate three synchronous dynamic random access memory (DDR3 SDRAM), double data rate four synchronous dynamic random access memory (DDR4 SDRAM), double data rate five synchronous dynamic random access memory (DDR5 SDRAM), graphics double data rate five synchronous dynamic random access memory (GDDR5 SDRAM), graphics double data rate five x synchronous dynamic random access memory (GDDR5x SDRAM) and/or graphics double data rate six synchronous dynamic random access memory (GDDR6 SDRAM). The memory controller 16 may communicate with the three memory banks 20A, 20B, and 20C via memory buses 24, 26, and 28, which may respectively interconnect the memory controller 16 with the three memory banks 20A, 20B, and 20C. In alternative embodiments, the memory management system 12 may include more or fewer memory buses and memory banks 20.

The memory (e.g., memory banks 20) may include error detection code (EDC) pads 30A, B, and C where two types of data may be provided to the memory controller 16. Specifically, the EDC pads 30A-C may provide a calculated error correction checksum, when in an error detection mode. Further, when in a standby state, an EDC hold pattern may be provided as a background pattern. As will be discussed in detail below, the EDC hold pattern circuitry/logic 14 may synchronize provision of an EDC hold pattern, resulting in timely provision of the EDC hold pattern.

Figure 1B:
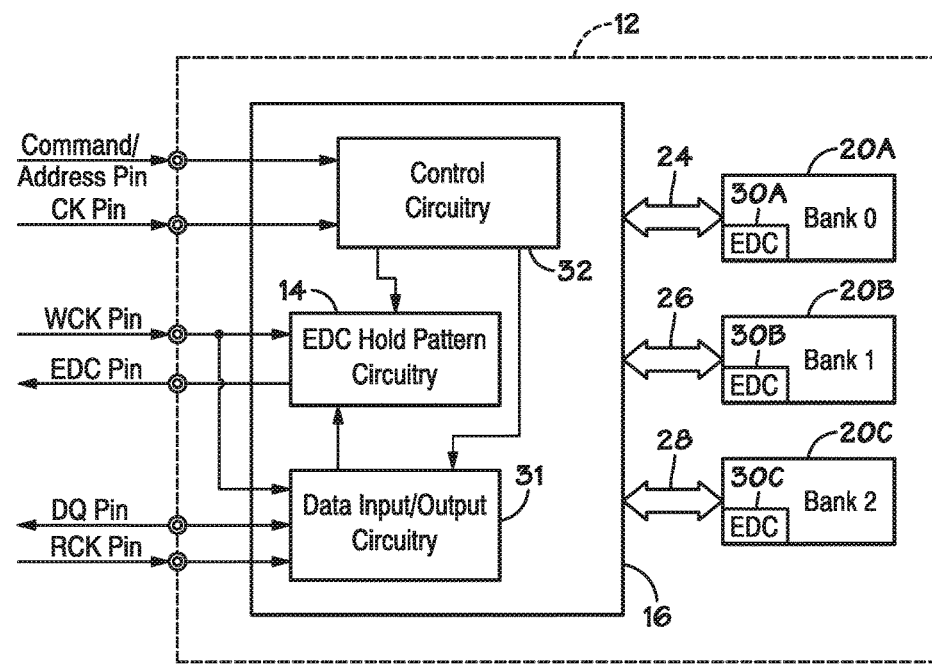
FIG. 1B is a block diagram illustrating an exemplary embodiment of the memory management system of FIG. 1A.

FIG. 1B is a block diagram illustrating an exemplary embodiment of the memory management system of FIG. 1A. The memory management system 12 may include a semiconductor memory device such as DRAM chip. The memory management system 12 may further include a control circuitry 32, which may receive a memory control signal such as the logical address and memory control command via an external command/address pin from the MMU 22. The memory control command may include a read command, a write command or a no operation command (NOP). The control circuitry 32 may receive the CK via an external pin from the MMU 22. The EDC hold pattern circuitry 32 may receive a control signal from the control circuitry 32 and the data (e.g., write) clock WCK via an external pin from the MMU 22. The EDC hold pattern circuitry 32 may provide EDC to the MMU 22 via an external EDC pin. The memory management system 12 may include a data input/output circuitry 31, which may communicate write or read data with the MMU 22 via an external DQ pin. The write and read operation of the data may be controlled by the write clock WCK and a read clock RCK, respectively. The RCK may be supplied from the MMU 22 via an external RCK pin. The circuitry 31 may provide the write or read data to the EDC hold pattern circuitry 14 so that the circuitry 14 can produce the EDC.

Turning now to a discussion of memory control via signal timing, FIG. 2 is a timing diagram 100, illustrating provision of EDC data 102 and an EDC hold pattern 104, in accordance with an embodiment of the present disclosure. Because this timing diagram 100 illustrates initialization of the electronic device 10, prior to receiving the EDC data 102 (e.g., CRC burst E0 to E7), the EDC hold pattern 104 may be undefined. However, by providing a hold pattern reset, the correct EDC hold pattern may be properly synchronized, as will be discussed in more detail below.

Clock CK inputs 106 are differential system clock inputs (e.g., CK_c and CK_t). Clock WCK inputs 108 are a second set of differential data clock inputs (e.g., WCK_c and WCK_t). As illustrated, the frequency of the WCK inputs 108 is twice that of the frequency of the CK inputs 106. Commands 110 may be registered at every rising edge of CK_t, while addresses 112 may registered at every rising edge of CK_t and every rising edge of CK_c.

The WRITE latency (WLmrs) 113 is the delay in clock cycles used in the calculation of the total WRITE latency (WL) between the registration of the WRITE command 114 and the availability of a first piece of input data. In the current embodiment, the WLmrs is set to five cycles, but could vary in other embodiments (e.g., based upon DRAM vendor specifications, etc.). The DQ/DBI timing 116 illustrates when data 118 is written after the WLmrs 113.

The CRC Read Latency 120 (CRCRL) provides an indication of a delay in clock cycles to lapse prior to reading cyclic redundancy check (CRC) data. In the depicted embodiment, the CRCRL 120 is set to eight cycles, but could vary in other embodiments (e.g., based upon DRAM vendor specifications, etc.). As illustrated, the EDC data 102 is provided at T13, after the CRCRL 120 is complete.

Once the EDC data 102 is provided, the EDC hold pattern 104 is once again provided. As illustrated at time T15, a proper starting time for the EDC hold pattern 104 is synchronous to a rising edge (e.g., rising edge 122) of CK_t. The provision of the EDC hold pattern may be facilitated by programming a mode register with a four bit pattern. These four bits are transmitted during a CK_t cycle. The EDC hold pattern 104 may be repeated, such that the EDC hold pattern 104 is provided before and after providing any CRC data 102, as illustrated in FIG. 2.

The EDC hold pattern 104 is transmitted by data path circuitry/logic of the electronic device (e.g., electronic device 10 of FIG. 1). The data path circuitry/logic may be synchronized to the WCK_t clock. As discussed above, the frequency of the WCK_t clock may vary from the frequency of the CK_t clock. For example, the frequency of the WCK_t clock may be twice the frequency of the CK_t clock, as illustrated in FIG. 2. Thus, the four bits of the EDC hold pattern 104 may be transmitted with two rising and two falling edges of the WCK_t clock, within one cycle of the CK_t clock.

During chip initialization, the rising edge of the WCK_t clock starts delivering the EDC hold pattern 104. Unfortunately, during this initialization phase, the EDC hold pattern may start one WCK_t clock cycle later than a corresponding CK_t cycle, shifting the EDC hold pattern 104 provision by two bits, resulting in unsynchronized provision of the EDC hold pattern 104. FIG. 3 is a timing diagram 160 illustrating a comparison between an unsynchronized EDC hold pattern timing 162 and a synchronized EDC hold pattern timing 164 that results from the EDC hold pattern circuitry 14 of FIG. 1, in accordance with an embodiment of the present disclosure.

Since there are two rising edges (e.g., edge 166 and edge 168) of the WCK_t clock 170 within one cycle (e.g., cycle 172) of the CK_t clock 174, only one of the rising edges of the WCK_t clock 170 within a cycle of the CK_t clock 174 is synchronous to a rising edge (e.g., edge 176) of the CK_t clock 174. Since the data path circuitry/logic that selects between a first data path for outputting the CRC data and a second data path for outputting a preset EDC hold pattern is synchronized with a rising edge of the WCK_t clock, a failed synchronization (e.g., transmitting an EDC hold pattern 140 at a time not synchronous to a rising edge of the CK_t clock 174) may occur. For example, the data path circuitry/logic may trigger transmission of the EDC hold pattern at a WCK_t clock 170 rising edge (e.g., edge 168) that is not synchronous to a rising edge of the CK_t clock 174. For example, as illustrated by the unsynchronized EDC hold pattern timing 162, the data path circuitry/logic transmits an unsynchronized EDC hold pattern 140', where transmission of the first bit 178 of the unsynchronized EDC hold pattern 140' is triggered based upon rising edge 168 of the WCK_t clock 170. However, rising edge 168 is not synchronous to a rising edge of the CK_t clock 174. Instead, rising edge 168 is synchronous to a falling edge 180 of the CK_t clock 174. Thus, provision of the EDC hold pattern 140' is not properly synchronized to a rising edge (e.g., edge 176) of the CK_t clock 174.

However, as will be discussed in more detail below, the EDC hold pattern circuitry/logic 14 of FIG. 1 may ensure proper synchronization of the EDC hold pattern 140 to a rising edge (e.g., edge 176) of the CK_t clock 174. For example, as illustrated by synchronized EDC hold pattern timing 164, transmission of the first bit 182 of the synchronized EDC hold pattern 140 is triggered based upon the rising edge (e.g., edge 166) of the WCK_t clock 170. The rising edge 166 is synchronous to a rising edge (e.g., edge 176) of the CK_t clock 174, resulting in synchronized transmission of the EDC hold pattern 140. For example, the entire four bits of the EDC hold pattern 140 are transmitted during the cycle 172 of the CK_t clock 174.

Figure 4:
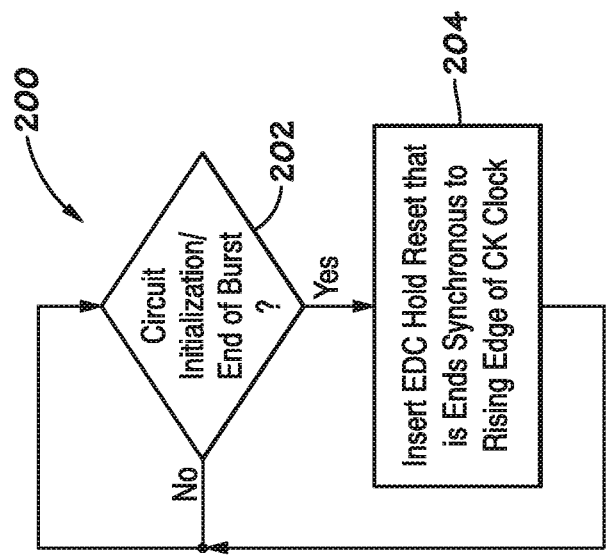
FIG. 4 is a flowchart, illustrating a process for introducing an EDC hold reset, in accordance with an embodiment.

Turning now to circuitry/logic for ensuring synchronization of the EDC hold pattern 140, FIG. 4 is a flowchart, illustrating a process 200 for introducing an EDC hold reset, in accordance with an embodiment. The EDC hold reset may provide context for triggering provision of an EDC hold pattern 140 at a rising edge of the CK_t clock 174 of FIG. 3. The EDC hold pattern circuitry/logic may continuously poll for a circumstance where the memory device is in an initialization cycle (decision block 202). When such a circumstance is detected, the EDC hold pattern circuitry/logic may introduce an EDC hold reset signal (block 204). The EDC hold pattern circuitry/logic may stop the EDC hold reset synchronous to the rising edge of the CK_t clock (e.g., rising edge 176 of CK_t clock 174 of FIG. 3).

Figure 5:
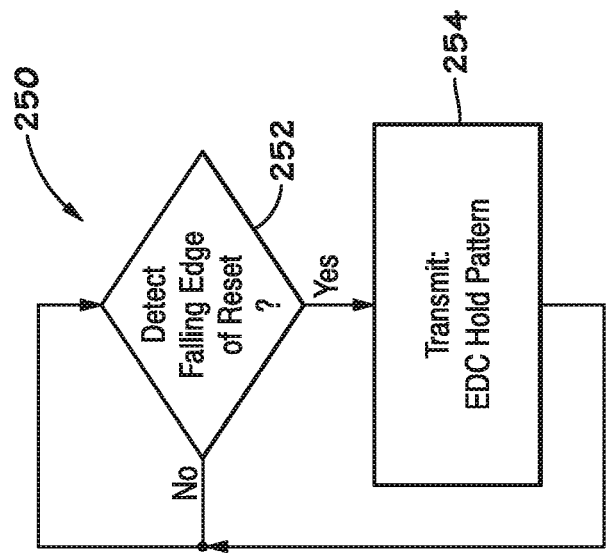
FIG. 5 is a flowchart, illustrating a process for using an EDC hold reset to provide an EDC hold pattern, in accordance with an embodiment.

Accordingly, when transmission of the EDC hold pattern 140 is triggered based upon the EDC hold reset, synchronized provision of the EDC hold pattern 140 may be ensured. FIG. 5 is a flowchart, illustrating a process 250 for triggering transmission of an EDC hold pattern based upon an EDC hold reset, in accordance with an embodiment. As illustrated, the EDC hold pattern circuitry/logic may continuously poll for a circumstance where a falling edge of an EDC hold pattern reset is detected (decision block 252). When such a circumstance is detected, the EDC hold pattern circuitry/logic may transmit the EDC hold pattern 140 (block 254). Because the falling edge of the EDC hold reset is synchronous to a rising edge of the CK_t clock (e.g. CK_t clock 174 of FIG. 3), transmission of the EDC hold pattern 140 is synchronous to a rising edge of the CK_t clock.

FIG. 6 is a timing diagram 300, illustrating introduction of an EDC hold reset 302, resulting in proper synchronization of the EDC hold pattern 140, in accordance with an embodiment. As mentioned above, the synchronization of the EDC hold pattern generation may occur during initialization of electronic device 10, before memory command operations are performed. As illustrated, at time 304 (e.g., during device initialization, the EDC hold reset 302 is asserted. The EDC hold reset 302 assertion may occur independent of rising and/or falling edges of the CK_t clock 310. However, the EDC hold reset 302 is stopped (e.g., as illustrated by falling edge 306) synchronous to the rising edge 308 of the CK_t clock 310. When the falling edge 306 of the EDC hold reset 302 is detected, transmission of the EDC hold pattern 140 is triggered, resulting in synchronized transmission of the EDC hold pattern 140. Because the hold pattern generation continues during operation, once the hold pattern generation is started and synchronized (e.g., during initialization), the hold pattern may remain synchronized, without additional use of the EDC hold reset 302 during the period of operation.

FIG. 7 is a block diagram, illustrating circuitry 350 that may implement the EDC hold reset, in accordance with an embodiment. As illustrated, the memory controller 16 may include a clocked data flip flop 352, which may receive command data 354 (e.g., decoded command signals) and is enabled by clock signal 356 (e.g., the CK_t clock 174 of FIG. 3). For example, the data flip flop 352 input may be "0" when the input command is "NOP" and "1" when the input command is "non-NOP."

EDC hold pattern generation circuitry/logic may include a clocked data flip flop 360 that is enabled according to a second clock signal 362 (e.g., the WCK_t clock 170 of FIG. 3). As mentioned above, transmission of the EDC hold pattern 140 may be triggered based upon a falling edge/deassert of an EDC hold reset 302. Accordingly, the EDC hold reset 302 may be provided by the clocked data flip flop 352 to the clocked data flip flop 360, after inversion (e.g., by invertor 364). Accordingly, the data flip flop 360 latches and outputs the latched signal "1" or "0" in response to the rising edge of clock signal 356. Thus, the data flip flop 360 releases the hold pattern at the correct edge of the clock signal 362 when the command data 354 indicates that the commands are gone.

The memory controller 16 may provide a data selector signal 366 to a multiplexer 368 that receives EDC hold patterns 140 from the EDC hold pattern generation circuitry/logic 358 and calculated error correction checksum data from the EDC path circuits 370. The data selector signal 366 indicates whether calculated error correction checksum data (e.g., error detection mode is active) or an EDC hold pattern is to be transmitted (e.g., standby mode is active). Accordingly, when the data selector signal 366 indicates an active error detection mode, calculated error correction checksum data is transmitted from the EDC path circuits 370 to the transmission circuitry 372 for subsequent transmission. An example of this is shown in FIG. 2, where the EDC data 102 (e.g., E0-E7) is transmitted. Conversely, when the data selector signal 366 indicates an active standby mode, the EDC hold pattern 140 is provided by the EDC hold pattern generation circuitry/logic 358 to the transmission circuitry 372 for subsequent transmission. An example of this is shown in FIG. 2, where the EDC hold pattern 140 is transmitted after the EDC data 102 (e.g., E0-E7) is transmitted.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method, comprising:
   detecting a first scenario, comprising an initialization phase of a memory device, an impending end of an error correction checksum data delivery burst, or both; upon detection of the first scenario:
      asserting an error detection code (EDC) hold reset; and
      de-asserting the EDC hold reset synchronous to a rising edge of a command clock (CK_t clock), such that when transmission of an EDC hold pattern from data path circuitry timed to a data path clock (WCK_t) having a WCK_t frequency different than a CK_t frequency of the CK_t clock is triggered based upon a falling edge of the EDC hold reset, the transmission is synchronous to the rising edge of the CK_t clock.

2. The method of claim 1, comprising:
   detecting an occurrence of the falling edge of the EDC hold reset;
   triggering the transmission of the EDC hold pattern, based upon the occurrence of the falling edge of the EDC hold reset, such that the transmission is synchronous to the rising edge of the CK_t clock.

3. The method of claim 1, wherein the memory device comprises: double data rate type three synchronous random-access (DDR3) memory, double data rate type four synchronous random-access (DDR4) memory, double data rate type five synchronous random-access (DDR5) memory, double data rate type five synchronous graphics random-access (GDDR5) memory, double data rate type five x synchronous graphics random-access (GDDR5x) memory, double data rate type six synchronous graphics random-access (GDDR6) memory, or any combination thereof.

4. The method of claim 1, wherein the memory device comprises dynamic random-access memory (DRAM).

5. The method of claim 1, comprising:
   transmitting the EDC hold pattern and error correction checksum data via common EDC pads of the memory device.

6. The method of claim 1, wherein the WCK_t frequency is twice the CK_t frequency.

7. The method of claim 1, comprising asserting the error detection code (EDC) hold reset, via EDC hold pattern generation circuitry, by timing a first data flip flop of EDC hold pattern synchronization logic to the CK_t clock and providing, via the first data flip flop, the EDC hold reset to the EDC hold pattern generation circuitry.

8. An electronic device, comprising:
   a command clock (CK_t clock);
   a data path clock (WCK_t);
   error detection code (EDC) hold pattern generation circuitry, configured to:
      upon detection of an initialization phase of a memory device, an impending end of an error correction checksum data delivery burst, or both:
         assert an EDC hold reset; and
         de-assert the EDC hold reset synchronous to a rising edge of the command clock (CK_t clock), such that when transmission of an EDC hold pattern from data path circuitry timed to the data path clock (WCK_t) having a WCK_t frequency different than a CK_t frequency of the CK_t clock is triggered based upon a falling edge of the EDC hold reset, the transmission is synchronous to the rising edge of the CK_t clock.

9. The electronic device of claim 8, comprising:
   detecting an occurrence of the falling edge of the EDC hold reset;
   triggering the transmission of the EDC hold pattern, based upon the occurrence of the falling edge of the EDC hold reset, such that the transmission is synchronous to the rising edge of the CK_t clock.

10. The electronic device of claim 8, comprising the memory device, wherein the memory device comprises: double data rate type three synchronous random-access (DDR3) memory, double data rate type four synchronous random-access (DDR4) memory, double data rate type five synchronous random-access (DDR5) memory, double data rate type five synchronous graphics random-access (GDDR5) memory, double data rate type five x synchronous graphics random-access (GDDR5x) memory, double data rate type six synchronous graphics random-access (GDDR6) memory, or any combination thereof.

11. The electronic device of claim 8, comprising the memory device, wherein the memory device comprises dynamic random-access memory (DRAM).

12. The electronic device of claim 8, comprising the memory device, wherein the electronic device is configured to transmit the EDC hold pattern and error correction checksum data via common EDC pads of the memory device.

13. The electronic device of claim 8, wherein the WCK_t frequency is twice the CK_t frequency.

14. The electronic device of claim 8, wherein the EDC hold pattern generation circuitry is configured to assert the error detection code (EDC) hold reset, by timing a first data flip flop of EDC hold pattern synchronization logic to the CK_t clock and providing, via the first data flip flop, the EDC hold reset to the EDC hold pattern generation circuitry.

15. An error detection code (EDC) hold pattern generation circuitry, configured to:
   upon detection of an initialization phase of a memory device, an impending end of an error correction checksum data delivery burst, or both:
      assert an EDC hold reset; and
      de-assert the EDC hold reset synchronous to a rising edge of a command clock (CK_t clock), such that when transmission of an EDC hold pattern from data path circuitry timed to the data path clock (WCK_t) having a WCK_t frequency different than a CK_t frequency of the CK_t clock is triggered based upon a falling edge of the EDC hold reset, the transmission is synchronous to the rising edge of the CK_t clock.

16. The EDC hold pattern generation circuitry of claim 15, configured to:
   detect an occurrence of the falling edge of the EDC hold reset;

trigger the transmission of the EDC hold pattern, based upon the occurrence of the falling edge of the EDC hold reset, such that the transmission is synchronous to the rising edge of the CK_t clock.

17. The EDC hold pattern generation circuitry of claim 15, wherein the memory device comprises: double data rate type three synchronous random-access (DDR3) memory, double data rate type four synchronous random-access (DDR4) memory, double data rate type five synchronous random-access (DDR5) memory, double data rate type five synchronous graphics random-access (GDDR5) memory, double data rate type five x synchronous graphics random-access (GDDR5x) memory, double data rate type six synchronous graphics random-access (GDDR6) memory, or any combination thereof.

18. The EDC hold pattern generation circuitry of claim 15, wherein the memory device comprises dynamic random-access memory (DRAM).

19. The EDC hold pattern generation circuitry of claim 15, configured to transmit the EDC hold pattern and error correction checksum data via common EDC pads of the memory device.

20. The EDC hold pattern generation circuitry of claim 15, configured to assert the error detection code (EDC) hold reset, by timing a first data flip flop of EDC hold pattern synchronization logic to the CK_t clock and providing, via the first data flip flop, the EDC hold reset to the EDC hold pattern generation circuitry.

\* \* \* \* \*